(12) United States Patent
Duan et al.

(10) Patent No.: US 11,215,772 B2
(45) Date of Patent: Jan. 4, 2022

(54) CONNECTOR AND CONNECTOR ASSEMBLY

(71) Applicant: DONGGUAN LUXSHARE TECHNOLOGIES CO., LTD, Dongguan (CN)

(72) Inventors: Baiyu Duan, Dongguan (CN); Zhen Luo, Dongguan (CN); Xiaoping Wu, Dongguan (CN); Xiaokai Wang, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/874,476

(22) Filed: May 14, 2020

(65) Prior Publication Data

US 2021/0135393 A1  May 6, 2021

(30) Foreign Application Priority Data

Nov. 6, 2019  (CN) .......................... 201911076460.1

(51) Int. Cl.
*G02B 6/42* (2006.01)
*H05K 7/20* (2006.01)
(Continued)

(52) U.S. Cl.
CPC ........... *G02B 6/4269* (2013.01); *G02B 6/426* (2013.01); *G02B 6/428* (2013.01); *G02B 6/4278* (2013.01); *H01R 13/516* (2013.01); *H01R 13/641* (2013.01); *H01R 13/717* (2013.01); *H05K 7/2039* (2013.01)

(58) Field of Classification Search
CPC .... G02B 6/4269; G02B 6/426; G02B 6/4278; G02B 6/428; H01R 13/516; H01R 13/651; H01R 13/717; H05K 7/2039
See application file for complete search history.

(56) References Cited

U.S. PATENT DOCUMENTS 4,598,965 A * 7/1986 Bricaud ................... H05K 7/12
                                                       439/329
5,932,925 A * 8/1999 McIntyre ............ H01L 23/4093
                                                       257/719

(Continued)

FOREIGN PATENT DOCUMENTS

CN          1841263 A    10/2006
CN        203942113 U    11/2014
(Continued)

*Primary Examiner* — Peter Radkowski
(74) *Attorney, Agent, or Firm* — Birch, Stewart, Kolasch & Birch, LLP

(57) ABSTRACT

Related to is the technical field of connectors and disclosed are a connector and a connector assembly. The connector includes a connector body, a heatsink and a light guide, where the connector body is provided with a limit member, the heatsink is disposed on an upper surface of the connector body and is provided with multiple heatsink clips spaced apart from each other and arranged side by side, the light guide is disposed on the connector body, and the limit member is configured to support the light guide. The connector assembly includes the connector described above and a docking connector plug-in fitted with the connector.

11 Claims, 5 Drawing Sheets

(51) Int. Cl.
*H01R 13/516* (2006.01)
*H01R 13/641* (2006.01)
*H01R 13/717* (2006.01)

(56) References Cited

U.S. PATENT DOCUMENTS

| | | | | |
|---|---|---|---|---|
| 6,563,696 | B1* | 5/2003 | Harris | H05K 3/325 |
| | | | | 361/619 |
| 7,286,352 | B2* | 10/2007 | Curtis | F28F 21/02 |
| | | | | 165/80.3 |
| 7,601,021 | B1* | 10/2009 | Yang | H01R 13/7172 |
| | | | | 439/487 |
| 10,069,248 | B2* | 9/2018 | Su | H01R 13/6583 |
| 10,561,045 | B2* | 2/2020 | Mammen | H05K 5/0017 |
| 2006/0232932 | A1* | 10/2006 | Curtis | H01L 23/3672 |
| | | | | 361/697 |
| 2008/0291638 | A1* | 11/2008 | Ma | H01R 4/50 |
| | | | | 361/719 |
| 2014/0248081 | A1* | 9/2014 | Too | H01L 23/4093 |
| | | | | 403/374.1 |
| 2017/0214170 | A1* | 7/2017 | Su | G02B 6/4269 |
| 2019/0289755 | A1* | 9/2019 | Mammen | F21V 29/70 |

FOREIGN PATENT DOCUMENTS

| | | |
|---|---|---|
| CN | 106990488 A | 7/2017 |
| CN | 208888421 U | 5/2019 |
| TW | M410180 U1 | 8/2011 |
| TW | M418473 U1 | 12/2011 |

\* cited by examiner

CONNECTOR AND CONNECTOR ASSEMBLY

CROSS-REFERENCES TO RELATED APPLICATIONS

This application claims priority to Chinese patent application No. 201911076460.1 filed on Nov. 6, 2019, disclosure of which is incorporated herein by reference in its entirety.

TECHNICAL FIELD

The present disclosure relates to the technical field of connectors, in particular, a connector and a connector assembly.

BACKGROUND

With the development of society and science and technology, the data transmission speed is developing rapidly. To meet demands of market for higher-density high-speed pluggable solutions, a quad small form-factor pluggable (QSFP) interface is generated.

The QSFP can be used as an optical fiber solution and is superior to a quad CX4 interface in speed and density. Since the QSFP can support data transmission of four channels at a speed of 10 Gbps per channel at the same port volume as an XFP, the QSFP can have a four times density than an XFP product and have a three times density than an SFP+ product. The QSFP which has four channels and a higher density than the CX4 has been adopted by InfiniBand standard.

However, the increase of the data transmission quantity of a high-speed connector can easily heat the whole system and the connector up.

Therefore, there is an urgent need for a connector and a connector assembly to solve the above technical problems.

SUMMARY

An object of the present disclosure is to provide a connector and a connector assembly so that it is feasible for a large amount of heat generated by the connector in use to be quickly dissipated into the air through a heatsink to cool the connector.

To achieve this object, the present disclosure provides a connector and a connector assembly.

In one aspect, a connector is provided. The connector includes a connector body, a heatsink and a light guide.

The connector body is provided with a limit member.

The heatsink is disposed on the upper surface of the connector body and is provided with multiple heatsink clips spaced apart from each other and arranged side by side.

The light guide is disposed on the connector body.

The limit member is configured to support the light guide.

In one embodiment, the light guide includes two light guide stripes spaced apart from each other and arranged side by side, every two adjacent heatsink clips of the plurality of heatsink clips form a recess, and the two light guide stripes are located in respective recesses or a same recess.

In one embodiment, one of the limit member and the light guide is provided with a positioning hole, and the other one of the limit member and the light guide is provided with a positioning protrusion plug-in fitted with the positioning hole.

In one embodiment, front ends of the two light guide stripes are connected through a first connecting bridge, and the positioning hole or the positioning protrusion is disposed on the first connecting bridge.

In one embodiment, lower parts of rear-half portions of the two light guide stripes are connected through a second connecting bridge, one of the second connecting bridge and the connector body is provided with a limit hole, and the other one of the second connecting bridge and the connector body is provided with a limit protrusion plug-in fitted with the limit hole.

In one embodiment, tails of the two light guide stripes are bent downward and connected through a third connecting bridge.

In one embodiment, the upper surface of the connector body is provided with a buckle, and the heatsink is clamped to the connector body through the buckle.

In one embodiment, the upper surface of the connector body is provided with a receiving opening, and the lower surface of the heatsink is provided with a heatsink block capable of extending into the receiving opening.

In one embodiment, the connector body is provided with buckles on two sides of the receiving opening and the buckles on the two sides of the receiving opening are misaligned.

In one embodiment, one of the two sides of the receiving opening is provided with at least two buckles.

In one embodiment, the heatsink is provided with a buckle position fitted with the buckle.

In one embodiment, the buckle includes an extending portion, a resilient portion and a pressing portion that are sequentially connected, the extending portion is disposed at an included angle with respect to the resilient portion, the pressing portion is disposed at an included angle with respect to the resilient portion and is located between the extending portion and the resilient portion, the resilient portion and the pressing portion are capable of extending into the buckle position, and the pressing portion is capable of pressing against the heatsink.

In one embodiment, the connector body is provided with multiple sockets and a respective heatsink is disposed above each socket.

In one embodiment, an optical module is disposed in the connector body, and the lower surface of the heatsink block is attached to the upper surface of the optical module.

In another aspect, a connector assembly is provided. The connector assembly includes the connector described above and a docking connector plug-in fitted with the connector.

The beneficial effects of the present disclosure is that a large amount of heat generated by the connector in use is quickly dissipated into the air through the heatsink so that the connector can be prevented from being burnt or even burnt out due to the high temperature.

Additionally, the light guide has an indication function so that whether related devices are conductive to each other can be quickly and clearly determined through the light guide.

Figure 1:
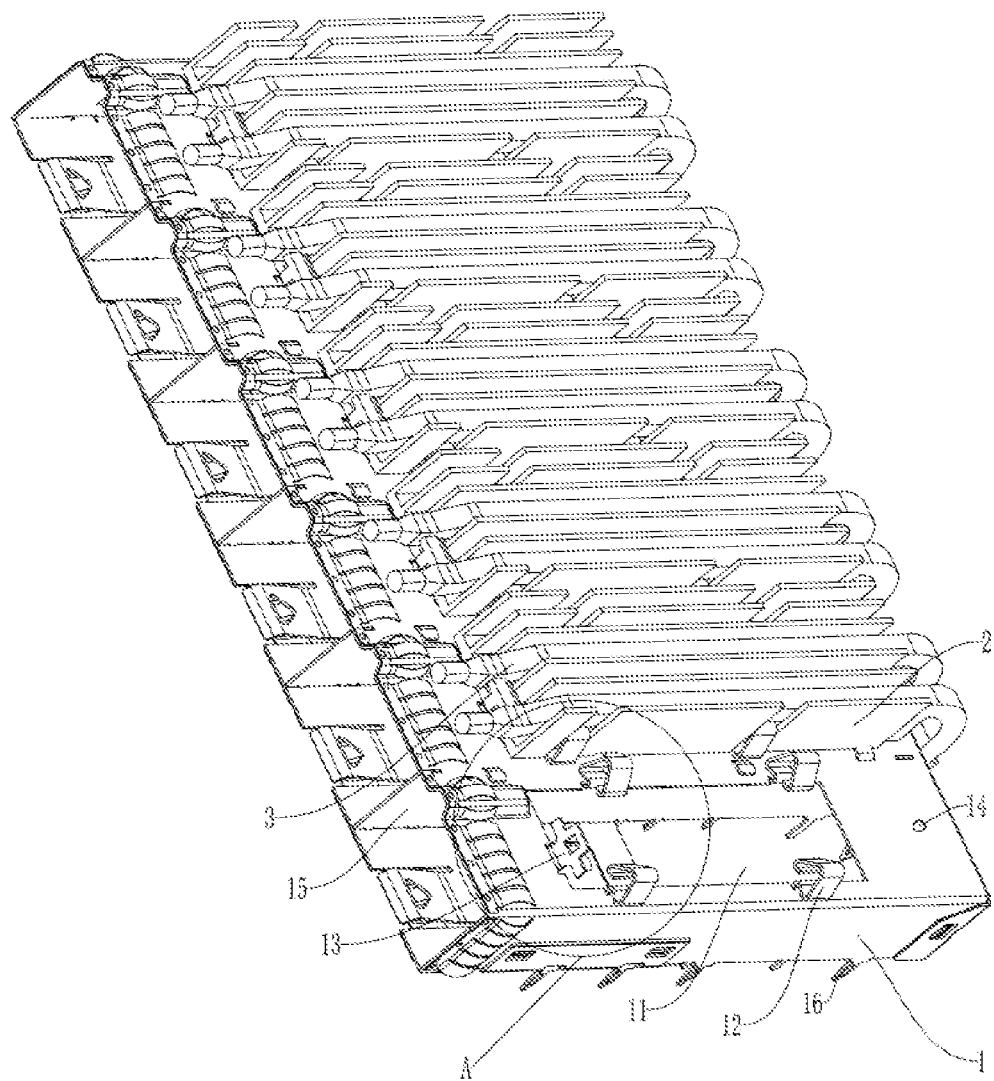
FIG. 1 is a structural schematic diagram illustrating a connector according to the present disclosure.

1. metallic casing; 11. receiving opening; 12. buckle; 121. extending portion; 122. resilient portion; 123. pressing portion; 13. limit member; 131. positioning hole; 14. limit hole; 15. metallic partition; 16. connecting pin;

2. heatsink; 21. heat conduction plate; 22. heatsink clip; 23. heatsink block; 24. buckle position;

3. light guide; 31. light guide stripe; 32. first connecting bridge; 321. positioning protrusion; 33. second connecting bridge; 331. limit protrusion; 34. third connecting bridge.

DETAILED DESCRIPTION

To illustrate the purpose and advantages of the present disclosure more clearly, the present disclosure will be described clearly and completely in conjunction with drawings. Apparently, the embodiments described below are part, not all, of embodiments of the present disclosure. Generally, the assemblies of the embodiments of the present disclosure described and illustrated in the drawings herein can be arranged and designed in various different configurations. Therefore, the following detailed description of the embodiments of the present disclosure provided in the drawings is not intended to limit the scope of the present disclosure, but merely represents selected embodiments of the present disclosure. Based on the embodiments of the present disclosure, all other embodiments acquired by those skilled in the art are within the scope of the present disclosure on the premise that no creative work is done.

It should be noted that similar reference numerals and letters indicate similar items in the following drawings, and therefore, once a particular item is defined in a drawing, the item need not to be further defined and explained in following drawings.

In the description of the present disclosure, it is to be noted that the orientational or positional relationships indicated by terms "above", "below", "left", "right", "vertical", "horizontal", "inside", "outside" and the like are based on the orientational or positional relationships illustrated in the drawings or the orientational or positional relationship that products of the present disclosure are usually used in, which are for the mere purpose of facilitating and simplifying the description of the present disclosure and do not indicate or imply that the apparatus or element referred to has a specific orientation and is constructed and operated in a specific orientation, and thus it is not to be construed as limiting the present disclosure. Moreover, terms "first", "second" and "third" are merely for distinguishing the description and are not to be construed as indicating or implying relative importance. In the description of the present disclosure, unless otherwise noted, "a plurality of" means two or more.

In the description of the present disclosure, it is further to be noted that, unless otherwise expressly specified and limited, terms "dispose" and "connection" should be understood in a broad sense, for example, may be a secured connection, a detachable connection or an integrated connection, or may be a mechanical connection or an electrical connection. For those skilled in the art, the preceding terms can be construed depending on specific contexts.

In the present disclosure, unless otherwise expressly specified and limited, when a first feature is described as "above" or "below" a second feature, the first feature and the second feature may be in direct contact or be in contact via another feature between the two features. Moreover, when the first feature is described as "on", "above" or "over" the second feature, the first feature is right on, above or over the second feature or the first feature is obliquely on, above or over the second feature, or the first feature is simply at a higher level than the second feature. When the first feature is described as "under", "below" or "underneath" the second feature, the first feature is right under, below or underneath the second feature or the first feature is obliquely under, below or underneath the second feature, or the first feature is simply at a lower level than the second feature.

The embodiments of the present disclosure are described in detail below, and examples of the embodiments are illustrated in the drawings, where the same or similar reference numerals indicate the same or similar elements or elements having the same or similar functions. The embodiments described below with reference to the drawings are merely exemplary and intended to explain the present disclosure, and are not to be construed as limiting the present disclosure.

As shown in FIGS. 1 to 6, disclosed is a connector, including a connector body, a heatsink 2 and a light guide 3. The connector body includes a metallic casing 1, a PCB (printed circuit board) and an optical module received in the metallic casing 1. The metallic casing 1 is provided with a socket, the PCB is disposed below the metallic casing 1, and the metallic casing 1 is secured onto the PCB. In one embodiment, a side wall of the metallic casing 1 extends downward with multiple connecting pins 16, each connecting pin 16 is inserted into a respective connecting hole on the PCB, and a free end of each connecting pin 16 is bent so that the metallic casing 1 is secured onto the PCB. The optical module is also secured onto the PCB and is electrically connected to the PCB.

Figure 3:
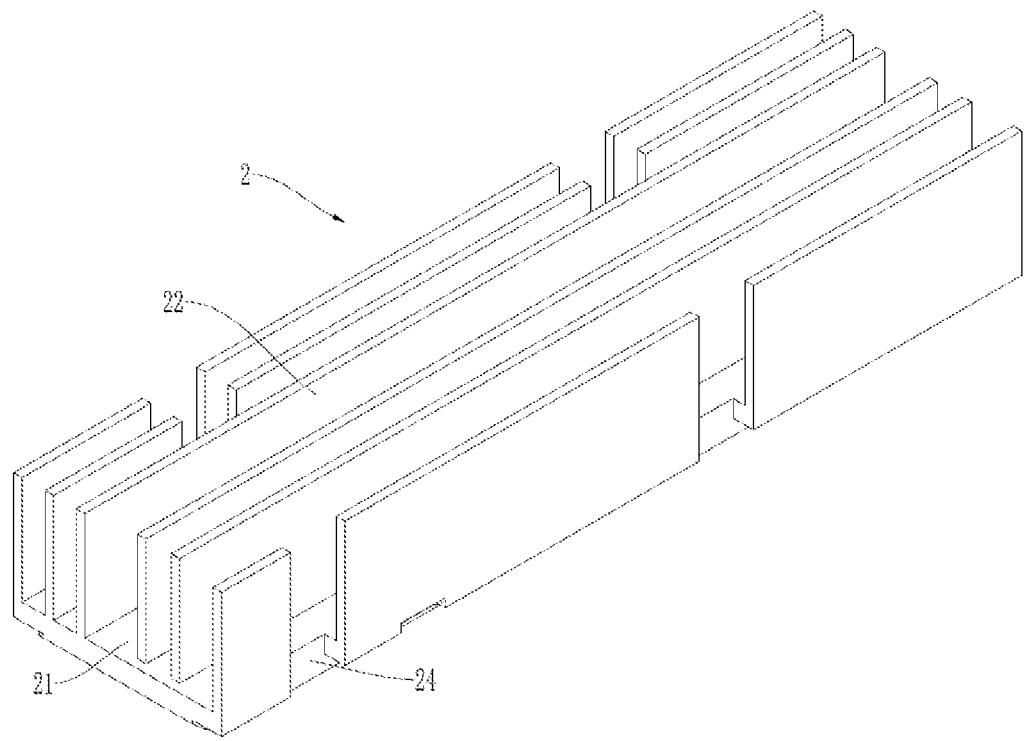
FIG. 3 is a structural schematic diagram illustrating one perspective of a heatsink according to the present disclosure.
Figure 4:
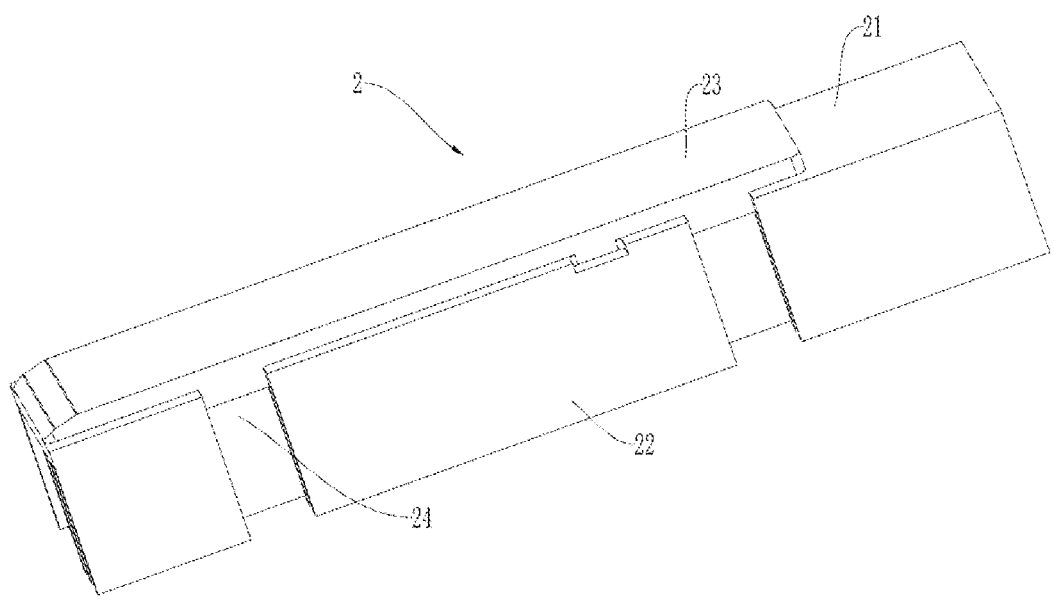
FIG. 4 is a structural schematic diagram illustrating another perspective of a heatsink according to the present disclosure.

As shown in FIGS. 3 and 4, the heatsink 2 is disposed on an upper surface of the connector body and provided with multiple heatsink clips 22 spaced apart from each other and arranged side by side. The multiple heatsink clips 22 are disposed along a length direction of the heatsink 2 and may quickly dissipate the heat of the heatsink 2 into the air to complete the heat dissipation and cooling of the connector body. Each heatsink clip 22 is made of a metallic material with high heat conduction, such as cooper, aluminum alloy or the like. The heatsink 2 includes a heat conduction plate 21 for supporting the multiple heatsink clips 22, and each heatsink clip 22 is vertically disposed on one side of the heat conduction plate 21. The heat conduction plate 21 is a heat pipe or a temperature equalization plate, and the heat pipe and the temperature equalization plate both have a fast heat conduction rate and may transfer heat to each part of the heat conduction plate 21 and then dissipate the heat through the multiple heat clips 22, thereby effectively avoiding great temperature differences between different parts of the heat conduction plate 21 that result in uneven heat dissipation.

Figure 2:
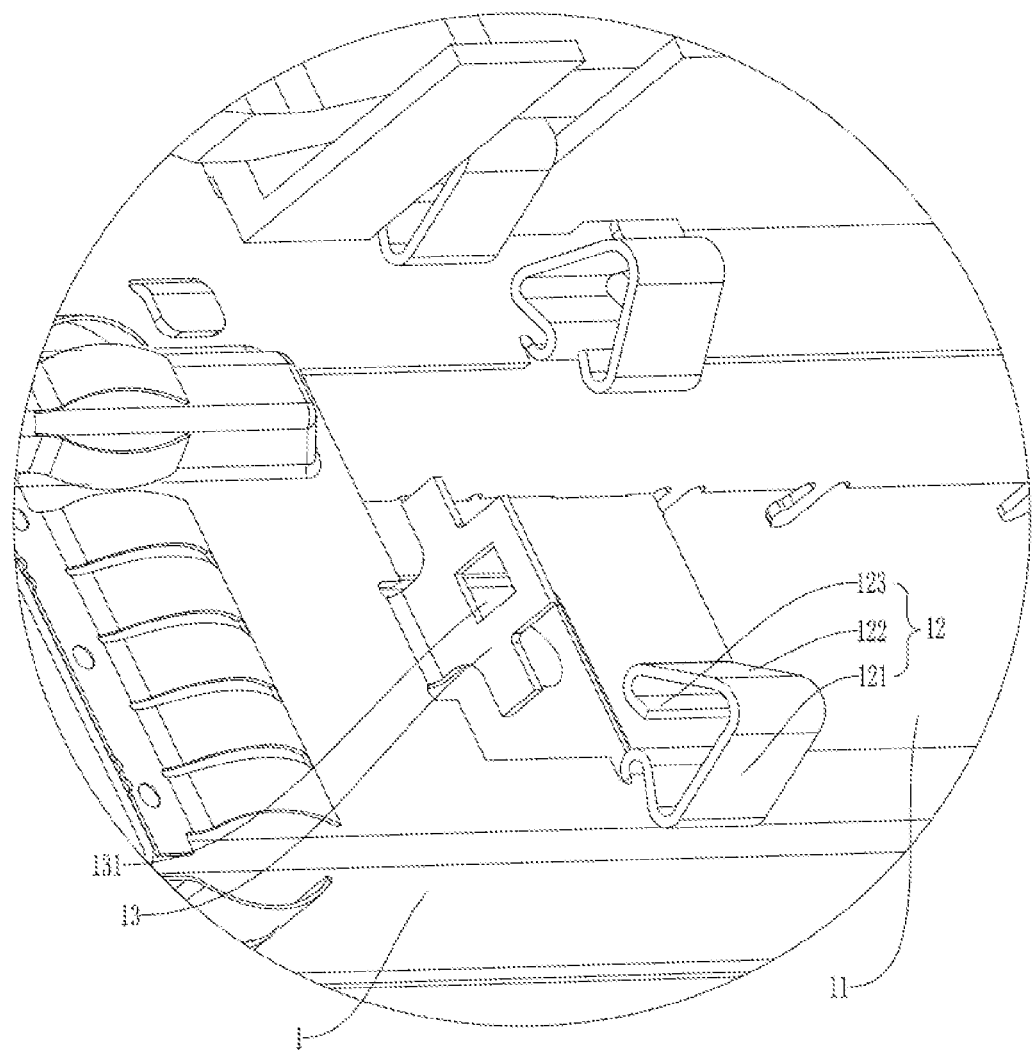
FIG. 2 is a partial enlarged view of part A of FIG. 1.

As shown in FIGS. 1, 2 and 4, the upper surface of the connector body is provided with a receiving opening 11 and a lower surface of the heatsink 2 is provided with a heatsink block 23 capable of extending into the receiving opening 11. That is, the receiving opening 11 is disposed in an upper wall of the metallic casing and the heatsink block 23 is disposed on one side of the heat conduction plate 21 facing away from the multiple heatsink clips 22. In this embodiment, a lower surface of the heatsink block 23 is attached to an upper surface of the optical module. In one embodiment, the heatsink block 23 is spaced apart from the optical module, a heatsink plate may be disposed between the heatsink block 23 and the optical module. The heatsink block 23 is made of high heat-conduction metal or other high heat-conduction materials and may rapidly transfer heat generated by the optical module to the heat conduction plate 21, and the heatsink plate is also made of high heat-conduction metal or other high heat-conduction materials.

As shown in FIG. 1, to meet the information transmission demands, the connector body is provided with multiple sockets, a respective heatsink 2 is disposed above each socket, and two adjacent sockets are separated by a metallic partition 15 disposed in the metallic casing 1. In one embodiment, the multiple sockets are disposed at a front end of the metallic casing 1 side by side, a respective optical module is disposed in each socket, and a respective receiving opening 11 and a respective heatsink 2 are disposed on the metallic casing 1 above each optical module.

As shown in FIGS. 1 to 3, the upper surface of the connector body is provided with a buckle 12, and the heatsink 2 is clamped to the connector body through the buckle 12. In one embodiment, the buckle 12 is disposed on the metallic casing, and the connector body is provided with buckles 12 on two sides of the receiving opening 11. In one embodiment, the buckles 12 on the two sides of the receiving opening 11 are misaligned, that is, asymmetrically disposed. In other embodiments, the buckles 12 on the two sides of the receiving opening 11 may be symmetrically disposed. Each of the two sides of the receiving opening 11 is provided with at least two buckles 12. In one embodiment, each of the two sides of the receiving opening 11 is provided with two buckles 12. In other embodiments, each of the two sides of the receiving opening 11 may be provided with one, three, four or even more buckles, which is specifically determined according to a length of the heatsink 2.

Two sides of the heatsink 2 is each provided with a buckle position 24 fitted with the buckle 12. The buckle position 24 is a notch disposed in the heat conduction plate 21 and a heatsink clip 22 at edges of the heat conduction plate 21, so that the buckle 12 is clamped to the heat conduction plate 21. In one embodiment, part of the buckle 12 is received in the notch and then the buckle 12 is clamped to the heat conduction plate 21 so that the heatsink 2 is clamped to the metallic casing 1. Moreover, part of the buckle 12 is located in the buckle position 24 and also limits the heatsink 2 so that the heatsink 2 is unmovable along a length direction of the heatsink 2, and each buckle position 24 is, but is not necessarily, in correspondence with at least one buckle 12. In this embodiment, each buckle position 24 corresponds to a respective buckle 12 so that the heat conduction plate is more firmly clamped and is prevented from moving along the length direction of the heatsink 2. Furthermore, the metallic casing 1 are provided with buckles 12 on the two sides of the heatsink 2, and the buckles 12 on the two sides of the heatsink 2 cooperate to prevent the heatsink 2 from moving along a width direction of the heatsink 2. The multiple buckles 12 on the two sides of the receiving opening 11 cooperate so that the heatsink 2 is secured onto the metallic casing 1.

The buckle 12 includes an extending portion 121, a resilient portion 122 and a pressing portion 123 that are sequentially connected, the extending portion 121 is disposed at an included angle with respect to the resilient portion 122, the pressing portion 123 is disposed at an included angle with respect to the resilient portion 122 and is located between the extending portion 121 and the resilient portion 122, the resilient portion 122 and the pressing portion 123 are capable of extending into the buckle position 24, and the pressing portion 123 is capable of pressing against the heatsink 2. To install the heatsink 2, firstly, the heatsink 2 is placed above the receiving opening 11, and two sides of the buckle position 24 of the heatsink 2 are pressed against the resilient portion 122 of the buckle 12; then, the heatsink 2 is pressed downward, and the resilient portion 122 is deformed under the force and moves to one side facing toward the extending portion 121; after the heatsink 2 moves downward in place, the resilient portion 122 rebounds to press the pressing portion 123 against the upper surface of the heat conduction plate 21. The pressing portion 123 presses against the heatsink 2 and thus can limit the vertical movement of the heatsink 2 so that the heat sink 23 can be attached to a light film clip.

A top of the extending portion 121 is located outside the receiving opening 11, and a bottom of the extending portion 121 has a preset distance from an edge of the receiving opening 11, where the preset distance is greater than a length of the pressing portion 123 so that the extending portion 121 and the pressing portion 123 do not interfere with the installation of the heatsink 2. In one embodiment, the buckle 12 is formed through a punching and bending process.

As shown in FIGS. 1, 2, 5 and 6, the connector body is provided with a limit member 13. In one embodiment, the limit member 13 is disposed on the metallic casing 1 and is formed through a punching and bending process. The light guide 3 is disposed on the connector body, and the limit member 13 is configured to support the light guide 3.

Figure 6:
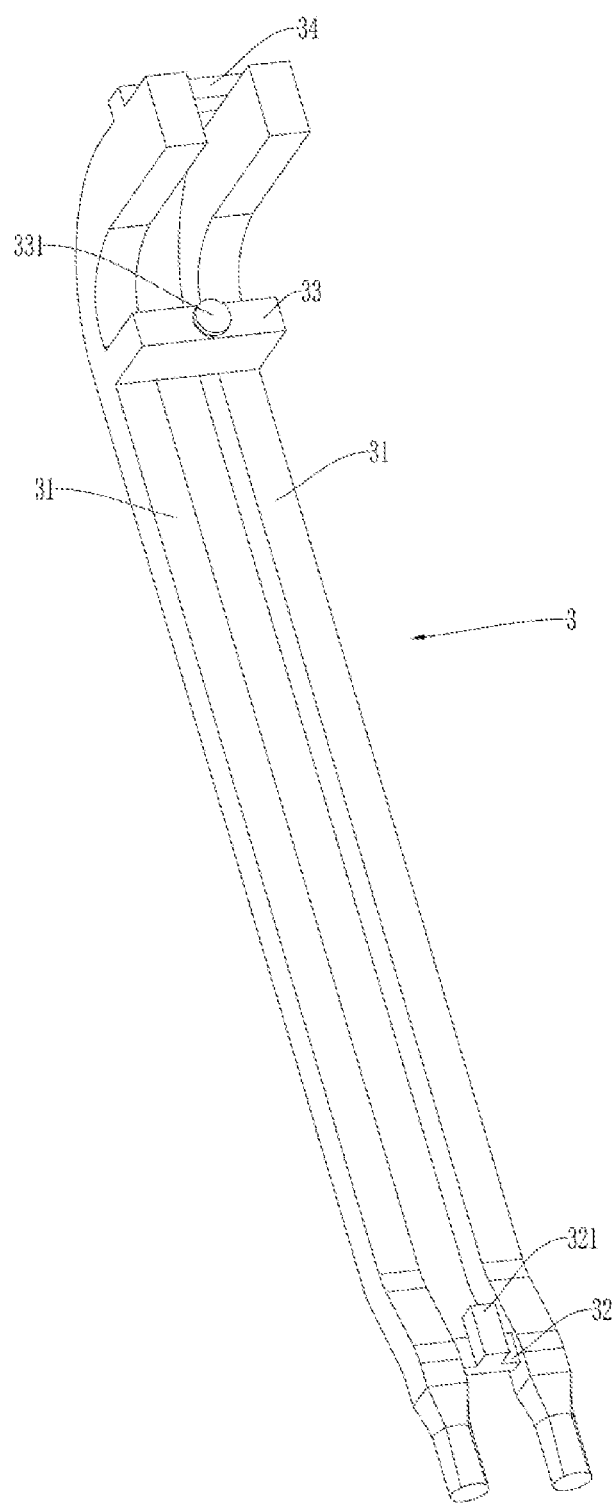
FIG. 6 is a structural schematic diagram illustrating a light guide according to the present disclosure.

Referring to FIG. 6, the light guide 3 includes two light guide stripes 31 spaced apart from each other and arranged side by side, and front ends of the two light guide stripes 31 are connected through a first connecting bridge 32 that is located below the two light guide stripes 31. A tail of each light guide stripe 31 is bent downward and the bent portion is located at a tail of the metallic casing. Lower parts of rear-half portions of the two light guide stripes 31 are connected through a second connecting bridge 33. In one embodiment, tails of unbent portions of the two light guide stripes 31 are connected through the second connecting bridge 33. Tails of the two light guide stripes 31 are connected through a third connecting bridge 34, that is, the bent portions of the two light guide stripes 31 are connected through the third connecting bridge 34, and the third connecting bridge 34 is located one side of the two light guide stripes 31 facing away from the metallic casing 1.

Figure 5:
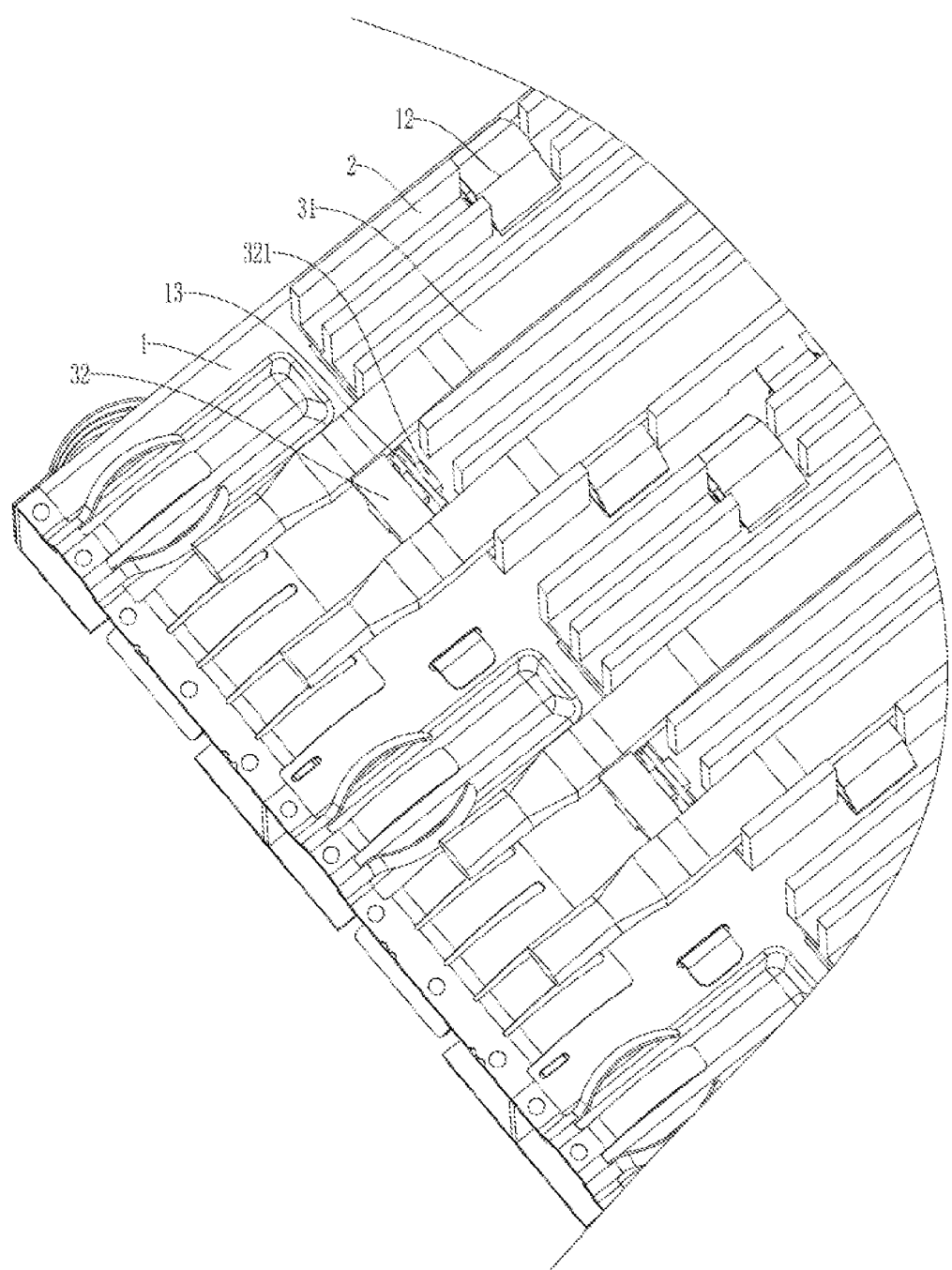
FIG. 5 is a partial structural schematic diagram illustrating a connector according to the present disclosure.

As shown in FIGS. 2, 5 and 6, two adjacent heatsink clips 22 forms a recess, and the two light guide stripes 31 are respectively located in a corresponding recess on the heatsink 2 or the two light guide stripes 31 are located in the same recess (not shown in the FIGS). One of the limit member 13 and the light guide 3 is provided with a positioning hole 131, and the other one of the limit member 13 and the light guide 3 is provided with a positioning protrusion 321 plug-in fitted with the positioning hole 131. In one embodiment, the positioning hole 131 or the positioning protrusion 321 is disposed on the first connecting bridge 32. In one embodiment, the limit member 13 is a limit clip, the positioning hole 131 is disposed on the limit clip, and the positioning protrusion 321 is disposed on the first connecting bridge 32 and protrudes toward the tails of the two light guide stripes. In other embodiments, the positioning hole 131 may further be disposed on the first connecting bridge 32, and the positioning protrusion 321 may further be disposed on the limit member 13.

One of the second connecting bridge 33 and the connector body is provided with a limit hole 14, and the other one of the second connecting bridge 33 and the connector body is provided with a limit protrusion 331 plug-in fitted with the limit hole 14. Moreover, a circumference at a top of the limit protrusion 331 is annularly provided with a stop protrusion, and the stop protrusion has a limit effect and thus can prevent the limit protrusion 331 from automatically falling off from the limit hole 14.

In one embodiment, the limit protrusion 331 is disposed on a lower surface of a second connecting bridge 33, and the limit hole 14 is disposed on the upper wall of the metallic casing 1 of the connector body. In other embodiments, the limit protrusion 331 may further be disposed on the connector body, and the limit hole 14 may further be disposed on the second connecting bridge 33. When the light guide 3 is installed, firstly, the positioning protrusion 321 is inserted into the positioning hole 131, and then the light guide 3 is pressed down so that the limit protrusion 331 is inserted into the limit hole 14 and the stop protrusion is located in the metallic casing 1 to play a limit and stop role. The positioning protrusion 321 and the positioning hole 131 cooperate and the limit protrusion 331 and the limit hole 14 cooperate so that the light guide 3 can be secured onto the metallic casing 1.

The connector further includes a pad (not shown in the FIGS) that is secured onto the PCB and located outside the tail of the metallic casing 1. Two receiving holes are disposed on the pad, and each light guide 3 corresponds to a respective pad. Free ends of the tails of the two light guide stripes 31 are inserted into the two receiving holes of the pad. A light-emitting assembly (not shown in the FIGS.) is disposed on the PCB, located in a respective receiving hole and optically connected to the free end of the tail of the respective light guide stripe 31. That is, each light guide stripe 31 is made of a light-transmitting material, and the light emitted by the light-emitting assembly may be refracted into the respective light guide stripe 31 so that the respective light guide stripe 31 can emit light. The light source of the light-emitting assembly is disposed in the respective receiving hole so that the spread of the light emitted by the light-emitting assembly can be reduced and the light of the light-emitting assembly can be completely transferred to the light guide 3.

The light-emitting assembly may indicate whether the PCB is conductive to the optical module. After the PCB is conductive to the optical module, the light-emitting assembly displays the light source and transfers the light source to the light guide 3, and the light guide 3 emits light for ease of observation. If the light guide 3 emits no light, then it means that the PCB is not conductive to the optical module.

A respective light-emitting assembly corresponding to each light guide stripe 31 is disposed on the PCB. In this embodiment, one of the two light guide stripes 31 is configured to indicate whether the PCB is conductive to the optical module, and the other one of the two light guide stripes 31 is configured to indicate whether the connector is conductive to a docking connector of the connector. If the docking connector is conductive to the connector, then another light guide 3 emits light; if the docking connector is not connected to the connector, then the another light guide 3 emits no light. The light guide 3 is larger than the light-emitting assembly in volume and is exposed outside the connector for ease of observation.

A large amount of heat generated by the connector in use is quickly dissipated into the air through the heatsink 2 so that the connector can be prevented from being burnt or even burnt out due to the high temperature.

Additionally, the light guide 3 has an indication function so that whether related devices are conductive to each other can be quickly and clearly determined through the light guide 3.

An embodiment further discloses a connector assembly. The connector assembly includes the connector described above and a docking connector plug-in fitted with the connector.

A large amount of heat generated by the connector in use is quickly dissipated into the air through the heatsink 2 so that the connector can be prevented from being burnt or even burnt out due to the high temperature.

Additionally, the light guide 3 has an indication function so that whether related devices are conductive to each other can be quickly and clearly determined through the light guide 3.

Apparently, the above embodiments of the present disclosure are merely illustrative of the present disclosure and are not intended to limit the embodiments of the present disclosure. For those of ordinary skill in the art, alterations or modifications in other different forms can be made based on the above description. Embodiments of the present disclosure cannot be and do not need to be exhausted herein. Any modifications, equivalent substitutions and improvements within the spirit and principle of the present disclosure fall within the scope of the claims of the present disclosure.

What is claimed is:

1. A connector, comprising:
a connector body, which is provided with a limit member;
a heatsink, which is disposed on an upper surface of the connector body and is provided with a plurality of heatsink clips spaced apart from each other and arranged side by side; and
a light guide, which is disposed on the connector body,
wherein the limit member is configured to support the light guide and fix only the light guide,
the upper surface of the connector body is provided with a buckle and the heatsink is clamped to the connector body through the buckle, and
the limit member and the buckle each are integrally disposed on the connector body.

2. The connector of claim 1, wherein the light guide comprises two light guide stripes spaced apart from each other and arranged side by side, every two adjacent heatsink clips of the plurality of heatsink clips form a recess, and the two light guide stripes are located in respective recesses or a same recess.

3. The connector of claim 2, wherein one of the limit member and the light guide is provided with a positioning hole and another of the limit member and the light guide is provided with a positioning protrusion plug-in fitted with the positioning hole.

4. The connector of claim 3, wherein front ends of the two light guide stripes are connected through a first connecting bridge, and the positioning hole or the positioning protrusion is disposed on the first connecting bridge.

5. The connector of claim 2, wherein lower parts of rear-half portions of the two light guide stripes are connected through a second connecting bridge, one of the second connecting bridge and the connector body is provided with a limit hole, and another of the second connecting bridge and the connector body is provided with a limit protrusion plug-in fitted with the limit hole.

6. The connector of claim 2, wherein tails of the two light guide stripes are bent downward and connected through a third connecting bridge.

7. The connector of claim 1, wherein the upper surface of the connector body is provided with a receiving opening and a lower surface of the heatsink is provided with a heatsink block capable of extending into the receiving opening.

8. The connector of claim 7, wherein the connector body is provided with buckles on two sides of the receiving opening and the buckles on the two sides of the receiving opening are misaligned.

9. The connector of claim 7, wherein one of the two sides of the receiving opening is provided with at least two buckles.

10. The connector of claim 1, wherein the heatsink is provided with a buckle position fitted with the buckle.

11. The connector of claim 10, wherein the buckle comprises an extending portion, a resilient portion and a pressing portion that are sequentially connected, the extending portion is disposed at an included angle with respect to the resilient portion, the pressing portion is disposed at an included angle with respect to the resilient portion and is located between the extending portion and the resilient portion, the resilient portion and the pressing portion are capable of extending into the buckle position, and the pressing portion is capable of pressing against the heatsink.

* * * * *